(12) United States Patent
Buhl et al.

(10) Patent No.: US 11,092,901 B2
(45) Date of Patent: Aug. 17, 2021

(54) WAFER EXPOSURE METHOD USING WAFER MODELS AND WAFER FABRICATION ASSEMBLY

(71) Applicant: Qoniac GmbH, Dresden (DE)

(72) Inventors: Stefan Buhl, Dresden (DE); Philip Groeger, Dresden (DE); Patrick Lomtscher, Dresden (DE)

(73) Assignee: Qoniac GmbH, Dresden (DE)

( * ) Notice: Subject to any disclaimer, the term of this patent is extended or adjusted under 35 U.S.C. 154(b) by 0 days.

(21) Appl. No.: 16/795,095

(22) Filed: Feb. 19, 2020

(65) Prior Publication Data

US 2021/0191272 A1 Jun. 24, 2021

Related U.S. Application Data

(60) Provisional application No. 62/952,220, filed on Dec. 21, 2019.

(51) Int. Cl.
*G06F 30/32* (2020.01)
*G03F 7/20* (2006.01)
*G01N 21/95* (2006.01)

(52) U.S. Cl.
CPC ......... *G03F 7/705* (2013.01); *G01N 21/9505* (2013.01); *G03F 7/70625* (2013.01); *G06F 30/32* (2020.01)

(58) Field of Classification Search
CPC . G03F 7/705; G03F 7/70625; G01N 21/9505; G06F 30/32
See application file for complete search history.

(56) References Cited

U.S. PATENT DOCUMENTS

| 2007/0186196 A1* | 8/2007 | Tanaka | G06F 30/367 716/111 |
| 2012/0191236 A1* | 7/2012 | Ausschnitt | G03F 7/705 700/105 |
| 2017/0053842 A1* | 2/2017 | Roessiger | G03F 7/70616 |
| 2017/0242425 A1* | 8/2017 | Buhl | G03F 7/70625 |

FOREIGN PATENT DOCUMENTS

| JP | 2007528985 A | 10/2007 |
| KR | 20180031899 A | 3/2018 |
| KR | 20180110025 A | 10/2018 |
| KR | 20190053269 A | 5/2019 |
| WO | 2019197129 A1 | 10/2019 |

OTHER PUBLICATIONS

WIPO, ISR for PCT/US2020/063849, Apr. 8, 2021.

* cited by examiner

*Primary Examiner* — Nghia M Doan
(74) *Attorney, Agent, or Firm* — Hodgson Russ LLP

(57) ABSTRACT

Critical dimension values can be obtained from wafer structures at predefined measurement sites. Coefficients of a preset model and another model with a different term are determined using critical dimension values from the measurement sites. The models approximate the critical dimension values, the process parameters and/or correction values of the process parameters as a function of at least two position coordinates. An updated model is selected from the models based on a criterion weighting the residuals between approximated critical dimension values, the number of terms of the model and/or the order or the terms of the model.

20 Claims, 5 Drawing Sheets

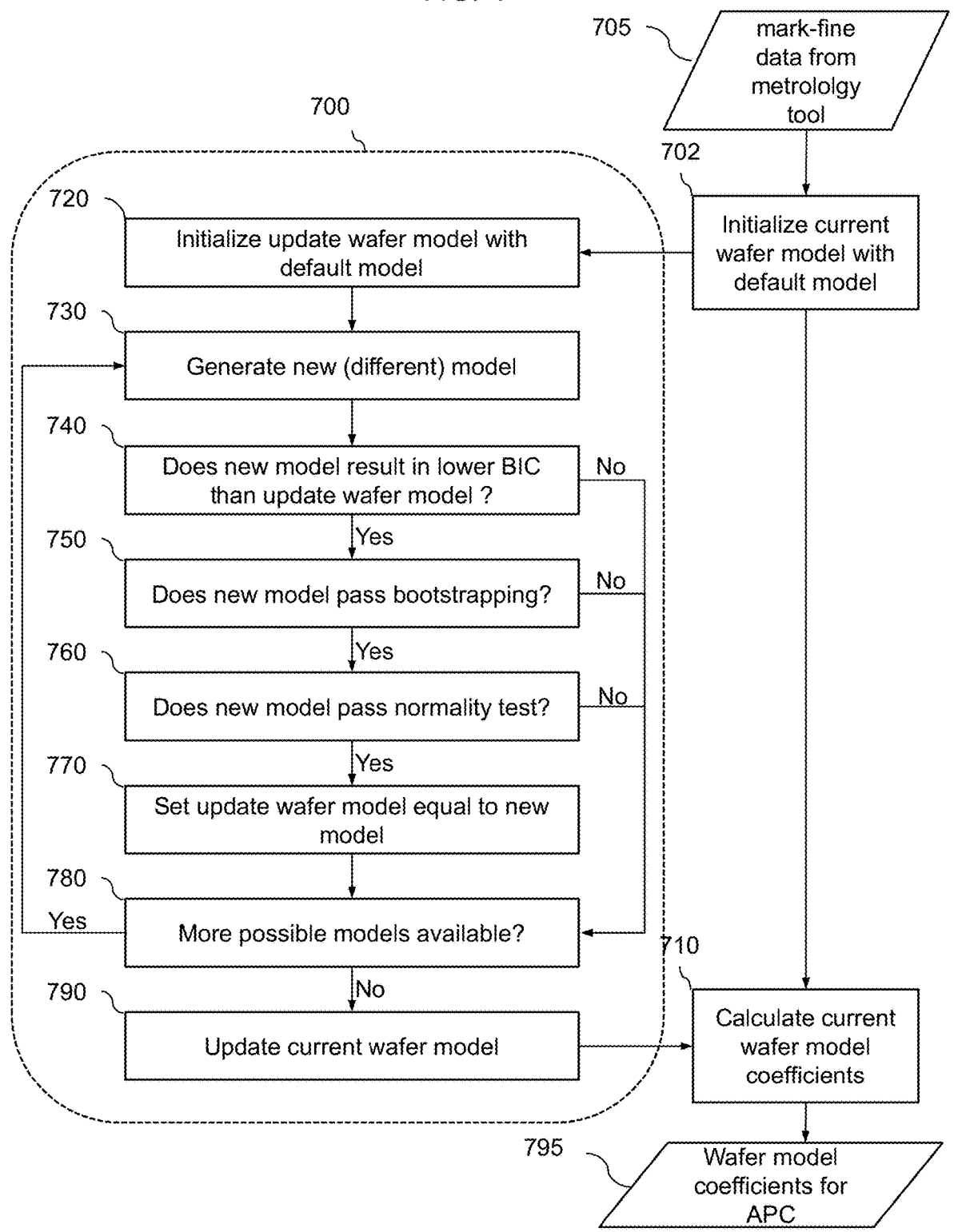

WAFER EXPOSURE METHOD USING WAFER MODELS AND WAFER FABRICATION ASSEMBLY

FIELD OF THE INVENTION

The present embodiments relate to the field of semiconductor lithography and patterning, and in particular to aspects of wafer models used for process monitoring and process control.

BACKGROUND

In the manufacturing of electronic devices such as integrated circuits, displays and sensors, a photolithography system transfers patterns from a reticle to a semiconductor substrate. The reticle contains circuit-design information. A photoresist layer coats the semiconductor substrate. An exposure process transfers the reticle pattern into the photoresist layer. Controllable parameters of the exposure process include focus and dose. The "focus" value may be given as a "defocus", which describes a distance between the actual focal plane and a reference plane for optimal patterning condition. The dose value gives a measure for the radiation power of the exposure beam. Typically, the best values for focus and dose depend on both the position coordinates of the exposure beam on the main surface. Since fluctuations in the process history of the substrate influence the exposure result, best focus and dose values are also time-dependent. Typically, a feedback loop for focus and dose provides focus and dose correction values for the next exposure on the basis of information obtained from the previously exposed substrate. The correction values are typically derived from information obtained from a comparatively low number of measurement sites. A wafer model supports interpolation of field-fine correction values or even intrafield correction values on the basis of the information obtained from the measurement sites.

There is a steady need for improving process monitoring and process control of patterning processes.

SUMMARY

An embodiment of the present application relates to a wafer exposure method. For a wafer exposure method, critical dimension values are obtained from wafer structures at predefined measurement sites. Position-dependent process parameters of an exposure process used for forming the wafer structures are obtained. From the critical dimension values at the measurement sites, coefficients of a preset model and at least one further model are determined. Each further model differs in at least one term from the preset model and from the other models. Each model approximates the critical dimension values, the process parameters and/or correction values of the process parameters as a function of at least two position coordinates. Residuals between approximated critical dimension values obtained from the models and the critical dimension values obtained at the measurement sites are determined. Among the preset model and the at least one further model an updated model is selected. The selection is based on a criterion that weights the residuals, the number of terms, and/or the order of the terms of the wafer model.

Another embodiment of the present application relates to a wafer fabrication assembly. The wafer fabrication assembly includes an exposure tool assembly. The exposure tool assembly exposes photoresist layers coating wafer substrates to an exposure beam, wherein the exposure tool assembly uses position-dependent process parameters to define wafer structures from the exposed photoresist layers. A processor unit is data-connected with the exposure tool assembly. The processer unit receives and/or holds position-dependent process parameters used in the exposure tool assembly for defining the wafer structures. The processor unit further receives critical dimension values of wafer structures obtained from the exposed photoresist layer at the predefined measurement sites. The processor unit determines, from the critical dimension values at the measurement sites, coefficients of a preset model and of at least one further model. Each further model differs in at least one term from the preset model and from the other models. The models approximate the critical dimension values, the process parameters and/or correction values of the process parameters as a function of at least two position coordinates. The processor unit determines residuals between approximated critical dimension values obtained from the models and the critical dimension values obtained at the measurement sites. Among the preset model and the at least one further model, the processor unit selects an updated model, wherein the selection is based on a criterion weighting the residuals, the number of terms of the model, and/or an order of terms of the model.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of an exposure method and a wafer fabrication assembly and together with the description serve to explain principles of the embodiments. Further embodiments are described in the following detailed description and the claims.

FIG. 4 shows a flow chart of a wafer exposure model update according to an embodiment.

DETAILED DESCRIPTION

Figure 1:
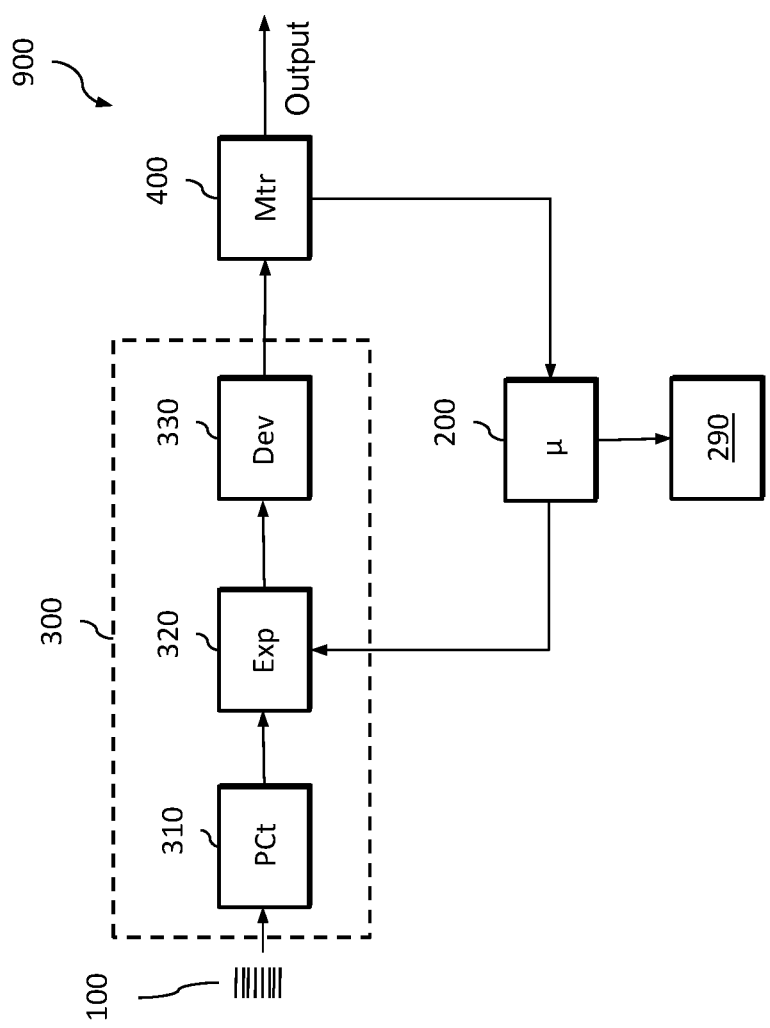
FIG. 1 is a schematic block diagram of a section of a wafer fabrication assembly including a processor unit for monitoring and/or controlling at least one exposure parameter according to an embodiment.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

An embodiment of the present disclosure relates to a wafer exposure method. The wafer exposure method includes obtaining critical dimension values of wafer structures at predefined measurement sites.

The wafer structures may include structures formed on or in a wafer substrate. The wafer substrate may be a thin disc that includes a substrate material. The substrate material may include a semiconducting material. For example, the wafer substrate may be a semiconductor wafer, a glass substrate including one or more semiconducting layers, or an SOI (silicon-on-insulator) wafer, by way of example.

The wafer structures may include trenches extending from a main surface at a front side of the wafer substrate into the wafer substrate. The trenches may be filled with a material different from a surrounding substrate material. Alternatively or in addition, the wafer structures may project from a main surface at a front side of the wafer substrate. Structures projecting from the main surface may include, e.g., pillars, stripe-shaped ribs and/or line patterns. Structures projection from the main surface may include photoresist structures.

Each critical dimension value quantitatively describes a physical property of one of the wafer structures or a positional relationship between two wafer structures.

The wafer exposure method may further include obtaining position-dependent process parameters of an exposure process that has been used for forming the wafer structures. The exposure process may use an exposure tool assembly. The exposure tool assembly may use an exposure beam for projecting a reticle pattern into a photoresist layer that coats the main surface of the wafer substrate. The process parameters include such parameters of the exposure process that may affect the critical dimension values. The process parameters may include such parameters of the exposure process that may be controlled as a function of the position of the exposure beam on the main surface.

From the critical dimension values obtained at the predefined measurement sites, coefficients of a preset model may be determined. The preset model may be a model which has been used for determining the exposure parameters for the previous exposure. In addition, the coefficients of at least one further model may be determined, wherein each further model differs in at least one term from the preset model and in at least one term from the other further models.

Each model may approximate a distribution of the critical dimension values across the main surface in closed mathematical form. The current model receives input information obtained from measurements at the measurement sites. From the input information, the model derives output information descriptive for a distribution of the critical dimension values across the complete main surface. The input information may include the measured critical dimension values and/or process parameters derived from the measured critical dimension values. The output information may include the estimated critical dimension values, updated process parameters and/or process parameter correction values as a function of the position. The output information may be displayed, transmitted to a higher-order process monitoring and/or administration system and/or may be used for controlling the exposure process across the complete main surface of a next wafer substrate or for a rework of the current wafer substrate.

The position may be described in position coordinates that unambiguously define each point of the substrate main surface. The position coordinates may be linear coordinates, e.g., orthogonal linear coordinates (x, y coordinate system) or polar coordinates (r, $\varphi$), by way of example. The position coordinates may describe the position of exposure fields (for inter-field correction) and/or positions within each exposure field (for intra-field correction).

Each model is represented by a sum of terms. Each (model) term includes at least one position coordinate and a coefficient. For example, each term may be a product of a coefficient and an algebraic function of at least one position coordinate.

The coefficients of each model may be obtained by using a fitting algorithm. The fitting algorithm searches for coefficients that minimize deviations between critical dimension values output by the respective model ("model CDs") and the actual critical dimension values ("actual CDs"). The actual CDs are the one directly obtained from the wafer structures at the predefined measurement sites on the current wafer substrate. The model CDs are those which the respective model outputs for the predefined measurement sites. The fitting algorithm may include a least squares method (LSM).

Then, for each concerned model separately, residuals between the output of the model and the actual CD values obtained from the wafer structures are determined. In other words, for each concerned model separately, the remaining differences between model CDs and the actual CDs are determined.

Then, among the preset model and the at least one further model, an updated model is selected. The selection may be based on a criterion that weights the magnitude of the residuals against the number of terms of the respective model and/or an order of terms of the model. Typically, the total residuals decrease with increasing complexity of the models, e.g. with the number of model terms. But only terms with high impact on the complete model, e.g. comparatively heavily weighted terms, typically represent physical effects in the production line of the wafer substrate, whereas low-weighted terms only or predominantly image noise effects. By considering the number of terms as a penalty term, the number of terms of a model may be limited to such terms that represent significant physical effects in the production line and that may also have a systematic effect on the next exposure. On the other hand, such terms of the model that cannot be assigned to a physical background, hardly contribute to improving the exposure process and may even have a diametrical effect on the efficiency of the model.

Control of the exposure process with the updated model instead of the predefined model can be more effect since the updated model is better aligned to the currently dominating physical effects in the production line. New model terms and/or skipped model terms may indicate significant changes of processes in the production line of the wafer substrates.

According to an embodiment, information descriptive for the terms of the updated model may be output. For example, any change of model terms may be displayed to a human operator or to a higher-order process monitoring and/or administration system. Any skip of a term of the model and any insertion of a term may indicate some significant change in the overall process signature. Therefore the information about cancelled model terms and/or about newly introduced model terms may be useful for process control.

According to an embodiment, the position-dependent process parameters used in the next exposure process may be updated on the basis of the updated model. In this way the information taken from the predefined measurement sites of a current wafer substrate can be immediately used for improving the next exposure process. The exposure process may be immediately adapted to a change in the process signature.

With the steady update of the model with in-line information the exposure process can follow such process deviations, which have not been detected in previously processed wafer substrates, after their first appearance and without intervention, for example, without intervention by an operator.

According to an embodiment the selection of the updated model may be based on a trade-off that weights the number of model terms against a total amount of the residuals. For example, an auxiliary function may be defined that combines a first term and a second term. The first term represents the quality of the model as a function of the number of model terms. The first term may steadily decrease with increasing number of model terms. The second term may increase with the number of model terms. The second term may steadily increase, for example monotonically increase. The terms may be combined additively or multiplicatively.

According to an embodiment the selection of the updated model may be based on at least one of a BIC (Bayesian information criterion or an AIC (Akaike information criterion. The BIC may be defined as in equation (1) and the AIC may be defined as in equation (2).

$$BIC = k \cdot \ln(n) - 2 \cdot \ln(\hat{L}) \quad \text{equation (1):}$$

$$AIC = 2k - 2 \cdot \ln(\hat{L}) \quad \text{equation (2):}$$

In equations (1) and (2) n gives the number of measurement sites, k gives the number of terms and $\hat{L}$ indicates a maximized value of the likelihood function, which may increase inverse proportional to the total residuals.

According to an embodiment, the model may include at least one of Zernike polynomials and/or Legendre polynomials. Zernike polynomials refer to a rotational coordinate system. Due to the shape of most wafer substrates and to the nature of the processes, many process deviations result in errors that can be comparatively well described with Zernike polynomials.

For example, the model may include polynomial terms with polar coordinates, e.g., for inter-field correction. Inter-field correction may reduce substrate-level deviations, e.g., effects based on deposition effects, wafer bowing, and others. For example, the model may include Zernike polynomials. In addition or alternatively, the model may include polynomial terms with Cartesian coordinates, e.g., for intra-field correction. Intra-field corrections may reduce reticle effects and/or design-specific effects. For example, the model may include Legendre polynomials.

According to an embodiment at least one of the further models may include all polynomials of a certain type up to a maximum order. For example, at least one further model may include all Zernike polynomials up to the maximum order. The maximum order may be in a range from 3 to 10. The maximum order may be the order at which the BIC or AIC has a minimum.

According to an embodiment, for each coefficient of the updated model a quality index may be determined. The quality index may give information about the degree of dependency of the coefficient from variations of the critical dimension values obtained at the sampling points.

The quality index may be derived from all predefined measurement sites or only from some of the predefined measurement sites. For example, the quality index may be derived only from such predefined measurement sites that significantly contribute to the coefficient. The quality index may be high, when slight variations of each of the critical dimension values have only low impact on the value of the coefficient and/or when the value of the coefficient is robust against single outliers at the side of the critical dimension values.

The quality index may be transmitted to a higher-order process monitoring and/or administration system or may be displayed to a human operator. In addition or alternatively, the selection of the terms for the updated model may consider the quality indices of the model terms. For example, selection of the terms for the updated model may include skipping terms which coefficients having a quality index below a preset threshold.

For example, the quality index may be calculated on the basis of a statistical approach, e.g., bootstrapping. For example, calculation of each coefficient may be repeated a plurality of times in different runs with different weights for the critical dimension values obtained from the sampling points. For example, in each repetition at least one other of the sampling points may be completely left out for the calculation of the coefficient and/or at least one other sampling point may be weighted by a factor two. The quality index assigned to the coefficient may be the higher, the smaller the differences between the results in the different runs for the concerned coefficient are.

According to an embodiment, the selection may be based on a criterion that weights a distribution of the residuals. For example, the selection may be based on a normality test. The normality test may include determining a degree of agreement between the distribution of the residuals for a respective model and a normal distribution. For example, the updated model may be that one that results in a best fitting between the distribution of the residuals and a normal distribution. The degree of agreement may be derived from a least square means error between a normal distribution and the distribution of the residuals for the respective model.

According to an embodiment directed to overlay error analysis and/or overlay correction, the critical dimension values may include overlay discrepancy values. Overlay errors occur between structures formed in different layers of the wafer substrate.

The overlay discrepancy values are descriptive for sort and degree of the overlay error between first wafer structures formed in a first horizontal layer and second wafer structures formed in a second horizontal layer. The overlay error may be position-dependent and may include at least one of a linear offset between the first wafer structures and the second wafer structures, a magnification or size reduction of the second wafer structures with reference to the first wafer structures, and a rotation of the second wafer structures with regard to the first wafer structures. The second horizontal layer may directly adjoin the first horizontal layer. In the alternative, a third horizontal layer may be formed between the first horizontal layer and the second horizontal layer.

A measurement site, from which an overlay discrepancy value is obtained, may be any area at the wafer substrate front side with a first use structure in the first horizontal layer and a second use structure in the second horizontal layer. Alternatively, the measurement site may be an area with a use structure formed in a first one of the first and second horizontal layers, and with an overlay mark in the second one of the first and second horizontal layers. According to a further alternative, the overlay discrepancy values may be obtained from areas including discrete overlay marks. Discrete overlay marks are exclusively or at least predominantly used to determine overlay errors.

Discrete overlay marks may include sets of parallel lines and/or box-shaped marks, by way of example. For example, an overlay mark may include a first box in the first horizontal layer and a second box in the second horizontal layer. The two boxes may have different size. Each box may include four line-shaped stripes arranged along the edges of a rectangle, e.g., a square.

For overlay analysis and/or overlay correction, the controllable process parameters may include position offsets. The position offsets may include linear offsets, e.g., an x offset and an y offset. The x offset may include information on a lateral displacement of a wafer substrate from a reference position along a first horizontal axis (x-axis). The y offset may include information on a displacement of the wafer substrate from the reference position along a second horizontal axis (y-axis). The second horizontal direction may run orthogonal to the first horizontal direction.

Further for overlay analysis and/or overlay correction, each model may include a wafer overlay model. The wafer overlay model approximates the overlay discrepancy values, position offsets, and/or the position offset correction values as a function of the position coordinates for the substrate main surface.

In terms reflecting the application of the wafer exposure method for overlay analysis and/or overlay correction, each wafer overlay model approximates the total overlay error across the substrate main surface in closed mathematical form. Each overlay model is represented by a sum of terms. Each (model) term includes at least one position coordinate and a coefficient. For example, each term may be a product of a coefficient and a function of at least one position coordinate.

The current overlay model receives input information obtained from measurements at the overlay marks. From the input information, the overlay model derives output information descriptive for the position-dependent overlay error across the complete substrate main surface. The input information may include the measured overlay errors at the overlay marks. The output information may include the estimated position-dependent overlay errors, updated position offsets and/or position offset correction values as a function of the position coordinates.

According to an embodiment, the overlay model may include terms as represented in equations (3) and (4).

$$\Delta x = \Gamma_1 \cdot x + R_1 \cdot x \cdot y + WM_1 \cdot y \quad \text{equation (3):}$$

$$\Delta y = \Gamma_2 \cdot y + R_2 \cdot x \cdot y + WM_2 \cdot x \quad \text{equation (4):}$$

The coefficients $\Gamma_1$, $\Gamma_2$, $R_1$, $R_1$, $WM_1$, $WM_2$ of each overlay model may be obtained from a fitting algorithm. The fitting algorithm searches for coefficient values that minimize deviations between modelled overlay error and the actual overlay error at the overlay marks. The actual overlay error is the one directly obtained from the overlay mark(s) of the current wafer substrate. The model overlay error is what the overlay model outputs for the position of the overlay marks. The fitting algorithm may include a least squares method.

Then, for each concerned overlay model separately, residuals between the output of the overlay model and the overlay error obtained at the overlay marks are determined. In other words, for each concerned overlay model separately, the remaining differences between model overlay error and the actual overlay error are determined.

Then, among the preset overlay model and the at least one further overlay model, an updated overlay model is selected. The selection may be based on a criterion that weights the magnitude and/or the distribution of the residuals against the number of terms and/or against a maximum order of the terms of the wafer overlay model as described above.

The output information may be displayed, transmitted to a higher-order process monitoring and/or administration system and/or may be used for rework. For example, the second wafer structures may be photoresist structures. The photoresist structures may be removed and a further photosensitive layer may be deposited in patterned in a further exposure process that may use the output information of the updated overlay model. According to an embodiment, the position-dependent position offsets used in the exposure of the wafer substrate may be updated on the basis of the updated overlay model.

According to an embodiment directed to exposure analysis and/or exposure correction, the critical dimension values may include critical dimensions (in the following: CDs) quantitatively describe at least one physical property of a physical wafer structure. For example, the CDs may include the diameter of a circular resist feature, the length of a short axis of a non-circular resist feature, the length of a long axis of a non-circular resist feature, the linewidth of a stripe-shaped resist feature, the width of a space between two resist features or between two substrate features in the same plane, the sidewall angles of a resist feature, the surface area of a resist feature, or the line edge roughness of a resist feature.

The measurement sites, from which the critical dimensions are obtained, may be sampling points. The sampling points may be within exposure fields, may be outside the exposure fields, e.g., in a wafer edge area, within chip areas and/or outside the chip areas, e.g., in the kerf area of the wafer substrate. Number and position of the sampling points may be defined in a sampling plan. The sampling plan may be static or may be dynamic. In a dynamic sampling plan, the position of one or more sampling points may change and/or the number of sampling points may change with time.

Also for exposure analysis and/or exposure correction, the controllable process parameters may include position-dependent exposure parameters of an exposure process used in a process for forming the wafer structures. The exposure parameters affect the critical dimensions. The exposure parameters may include absolute focus values, defocus values, focus correction values, dose values, dose correction values and/or any other parameter or set of parameters from which input parameters of the exposure method, e.g., the input parameters of an exposure tool assembly may be unambiguously derived. The exposure parameters may include one single parameter, e.g. the exposure dose or a focus value, or may include a combination of the exposure dose and a focus value.

The exposure parameters used in the exposure process that defines the physical wafer structure may be previously determined exposure parameters or may be received from an instance administering the exposure parameters. The instance administering the exposure parameters may be a processor unit integrated in or assigned to an exposure tool assembly in which the exposure takes place. Alternatively or in addition, the processor unit may be integrated in or assigned to a server apparatus data-connected with the exposure tool assembly.

Further for exposure analysis and/or exposure correction, each model may include a wafer exposure model. The wafer exposure model approximates the CDs, the exposure parameters, and/or exposure parameter correction values as a function of the position coordinates for the substrate main surface. Each wafer exposure model is represented by a sum of terms as described above.

The wafer exposure model may include polynomial terms with polar coordinates, e.g., for inter-field correction. Inter-field correction may reduce substrate-level deviations, e.g., effects based on deposition effects, wafer bowing, and others. Intra-field corrections may reduce design-specific effects. For example, the wafer model may include Zernike polynomials. In addition or alternatively, the wafer exposure model may include polynomial terms with Cartesian coordinates, e.g., for intra-field correction. For example, the wafer exposure model may include Legendre polynomials.

The current wafer exposure model receives input information obtained from measurements at the sampling points. From the input information, the wafer exposure model derives output information descriptive for a distribution of the critical dimensions across the complete main surface. The input information may include the measured CDs and/or exposure parameters derived from the measured CDs. The output information may include the estimated CDs, updated exposure parameters and/or exposure parameter correction values as a function of the position coordinates. The output information may be displayed, transmitted to a higher-order process monitoring and/or administration system and/or may be used for controlling the exposure process across the complete main surface of a next wafer substrate.

The total magnitude of the residuals is a measure for the remaining deviation between model CD and actual CD. In particular, the total magnitude of the residuals may give an impression of the quality of the respective physical model. With increasing number of terms in a physical model, the overall residuals get lower. But with increasing number of terms, to a steadily increasing degree the additional terms tend to let the wafer exposure model follow process-insignificant noise. A selection of the wafer exposure model based on a criterion that considers not only the residuals but also the number of terms of the wafer exposure model may result in that the updated wafer exposure model follows to a high degree only systematic errors, hence such errors that can actually be attributed to process effects in the process history.

The wafer structures may include photoresist structures, which may be formed on a main surface of a wafer substrate. The wafer substrate may be a thin disc that includes a substrate material. The substrate material may include a semiconducting material. For example, the wafer substrate may be a semiconductor wafer, a glass substrate including one or more semiconducting layers, or an SOI (silicon-on-insulator) wafer, by way of example.

The photoresist structures may include an activated or deactivated photoactive component. The photoresist structures are obtained by developing an exposed photoresist layer. The photoresist structures may include a plurality of laterally separated resist features. In other words, the photoresist structures may cover one or more first portions of the substrate main surface and may expose one or more second portions of the substrate main surface.

According to an embodiment, forming the photoresist structures may include exposing a first photoresistive layer, which is formed on the substrate main surface. The exposure uses the position-dependent exposure parameters.

The exposed first photosensitive layer may be developed, wherein from the exposed first photosensitive layer the photoresist structures are obtained. To this purpose, either the exposed sections of the first photosensitive layer may be selectively removed with respect to the unexposed, or the exposed sections of the first photosensitive layer may be selectively removed with respect to the exposed sections.

Applying the technique of updating the wafer exposure model based on a criterion that considers both the residuals and the number of terms of the wafer exposure model facilitates the manufacture of semiconductor devices such as memory devices, microprocessors, logic circuits, analog circuits, power semiconductor devices at high reproduction fidelity and may improve the yield of a manufacturing process for semiconductor devices, in particular of semiconductor devices with small lateral feature dimension below 100 nm.

According to an embodiment a second photoresistive layer may be exposed on a second wafer substrate, wherein the exposure uses position-dependent pairs of exposure parameters obtained from the updated wafer exposure model.

According to another embodiment the present disclosure relates to a wafer fabrication assembly. Unless otherwise noted, the description of the wafer fabrication assembly uses the terms and concepts introduced with reference to the above-mentioned wafer exposure method.

An exposure tool assembly may expose photoresist layers, which coat substrates, to an exposure beam according to position-dependent process parameters. The exposure tool assembly then forms photoresist structures from the exposed photoresist layers. For example, the exposure tool assembly may include a lithographic exposure unit and a developer unit. In the exposure unit, a reticle laterally modulates an exposure beam. The laterally modulated exposure beam activates a photoactive compound in exposed positions of the photoresist layer. The developer unit may selectively remove the exposed portions or the unexposed portions of the photoresist layer. The residuals of the photoresist layer form photoresist structures.

The photoresist structures and/or substrate structures derived from the photoresist structures form wafer structures. For example, the substrate structures may be obtained by etching the wafer substrate with the photoresist structures used as etch mask.

A processor unit may be data-connected with the exposure tool assembly. For example, the processer unit may receive position-dependent process parameters used in the exposure tool assembly for forming the photoresist structures. The processor unit and the exposure tool assembly may be directly data-connected, wherein the processor unit may receive position-dependent process parameters directly from the exposure tool assembly. Alternatively or in addition, the processor unit and the exposure tool assembly may be data-connected via another data administering unit, e.g., a server, wherein the processor unit may receive the position-dependent process parameters directly from the data administering unit. Alternatively or in addition, the processor unit may store previously used process parameters and may use process parameters that have been previously determined.

The processor unit may also receive critical dimension values of photoresist structures and/or substrate structures obtained from the photoresist structures at measurement sites.

From the critical dimension values at the measurement sites, the processor unit may determine coefficients of a preset model and of at least one further model, wherein each further model differs in at least one term from the preset wafer model and from the other wafer models, and wherein the wafer models approximate the critical dimension values and/or correction values of the process parameters as a function of at least two position coordinates. The processor unit may further determine, for each concerned model separately, residuals between the output of the model and the critical dimension values obtained from the wafer structure. Among the preset model and the at least one further model, the processor unit may select an updated model, wherein the selection is based on a criterion weighting the residuals against the number of terms and/or the order of terms of the model.

The critical dimension values may include overlay discrepancy values and/or CDs as described above. The process parameters may include exposure parameters and/or position offsets as described above. The model may include a wafer exposure model and/or a wafer overlay model as described above.

According to an embodiment, the processor unit may be configured to output information descriptive for the terms of the updated model.

According to an embodiment, the processor unit may be configured to update the position-dependent process parameters on the basis of the updated model and to output the updated position-dependent process parameters to the exposure tool assembly.

According to an embodiment, the wafer fabrication assembly may include a metrology unit that obtains, e.g. measures, critical dimension values of the wafer structures at the predefined measurement sites. The metrology unit may output the measured critical dimension values to the processor unit.

FIG. 1 shows a portion of a wafer fabrication assembly 900 with an exposure tool assembly 300. The exposure tool assembly includes a coater unit 310, a lithographic exposure unit 320 and a developer unit 330. A plurality of pre-processed wafer substrates 100 is successively supplied to the exposure tool assembly 300. The wafer substrates 100 may be semiconductor wafers, glass substrates with semiconductor layers or semiconductor elements formed thereupon or SOI (semiconductor-on-insulator) wafers, by way of example. Each of the coater unit 310 and the developer unit 330 may include two or more sub-units applying the same type of process.

The wafer substrates 100 of a substrate batch (e.g., a wafer lot) may be subjected to the same processes for forming the same electronic circuits. For example, the wafer substrates 100 of a substrate batch may be successively supplied to different process units of the same type, wherein process units of the same type apply the same type of process. Alternatively, the wafer substrates 100 may be successively supplied to the same process units, wherein each process unit may include one or more sub-units at which some of the wafer substrates 100 may be processed in parallel.

For example, the wafer substrates 100 may be supplied to the coater unit 310. The coater unit 310 deposits a photoresist layer on the main surface of each substrate 100. In addition to the photoresist layer, the coater unit 310 may deposit one or more auxiliary layers, e.g., an antireflective coating. For example, the coater unit 310 may include a spinner unit that dispenses a resist material on the substrate main surface and uniformly distributes the resist material by rotating the wafer substrate 100. The resist material may contain a photoactive component (PCA), a solvent and a resin. The coater unit 310 may include a heating facility for evaporating at least a portion of the solvent after coating. The photoresist-coated wafer substrates 100 are transferred to the exposure unit 320.

In the lithographic exposure unit 320, an exposure beam transfers a target pattern into the photoresist layer, wherein the exposure beam may activate or deactivate a photoactive component of the photoresist layer selectively in exposed portions. The exposure beam may be a beam of electromagnetic radiation or a particle beam. According to an embodiment the exposure beam includes light or electromagnetic radiation with a wavelength shorter than 365 nm, e.g., 193 nm or less, wherein the electromagnetic radiation passes a reticle or reflects at a reticle and images the reticle pattern into the photoresist layer.

In the portions of the photoresist layer exposed by the exposure beam the photoactive component may activate or de-activate a photoactive compound. For example, the exposure beam may affect a polymerization of a previously not-polymerized compound or a de-polymerization of a previously polymerized compound. After exposure, the photoresist layer contains a latent image of the reticle pattern.

Exposure of one wafer substrate 100 may include one single exposure of the complete substrate main surface or may include a plurality of exposures in neighboring exposure fields on the main surface. In the latter case, the same pattern may be imaged into each exposure field. Each exposure is defined by exposure parameters such as focus and dose as defined above. At least one of focus and dose may differ for different exposure fields on the same wafer substrate 100, between wafer substrates 100 of the same substrate batch and/or between different substrate batches. The wafer substrates 100 with the exposed photoresist layers are transferred to the developer unit 330.

The lithographic exposure unit 320 may further include a substrate stage. During exposure, the wafer substrate may be fixed on the substrate stage with an exposure field in an exposure position. The substrate stage may be movable with respect to the exposure beam, such that the exposure beam may scan the exposure fields along a linear scan direction (y direction) and/or anti-parallel to the scan direction. The exposure beam may scan each exposure field once or several times at uniform scan speed. After completion of the exposure of the exposure field, the substrate stage may move in at least one lateral direction, wherein another exposure field is placed at the exposure position.

The developer unit 330 uses different dissolving rates of exposed and unexposed portions of the photoresist layer to selectively dissolve either the exposed portions with respect to the unexposed portions or vice versa. The developer unit 330 may include a heating chamber for a post-exposure bake for evaporating solvent residuals and/or for chemically modifying the developed resist layer. For example, a heat treatment may harden the developed resist layer or may improve adhesion of the developed resist layer on the substrate main surface. The developed resist layer forms a photoresist structure. The photoresist structure may include a plurality of laterally separated resist features or may include one or more resist features with openings.

A metrology unit 400 may determine critical dimensions of critical photoresist features at sampling points as described above. The metrology unit 400 may be integrated part of the exposure tool assembly 300 or the wafer substrates 100 may be transferred to a remote metrology unit 400. The metrology unit 400 may also determine critical dimensions of wafer structures defined by photoresist structures. For example, the metrology unit 400 may determine critical dimensions of substrate features obtained by using the photoresist structures as etch mask. The sampling points are locations on the wafer substrate 100 defined in a sampling plan. The metrology unit 400 may obtain information on the critical dimension values by OCD (optical critical dimension) scatterometry, inspection of images obtained by SEM (scanning electron microscopy) and inspection of images obtained by optical microscopy, by way of example.

The critical dimension values may include any of the physical dimensions as described above. In the following, the abbreviation "CD" is to be understood as including all sorts of critical dimension values and is not limited to the widths of lines and spaces of critical resist features or to the area of critical resist features.

Prior to transfer to the metrology unit 400, a post-exposure process may use the resist pattern, e.g., as etch mask for forming grooves and/or trenches in the wafer substrate 100, as implant mask or as a mask for other modification processes. In this case, the metrology unit 400 may measure CDs of the post-processed substrate instead of features of the photoresist structure.

A processor unit 200 may receive the measured CDs obtained from the developed photoresist structures and/or post-processed wafer substrates 100 at the sampling points. The processor unit 200 may include advanced process control (APC) functionality. In other words, based on CDs obtained from one or more wafer substrates 100 previously processed at the same exposure tool assembly 300 or at another exposure tool assembly, the processor unit 200 may continuously update at least one exposure parameter in response to the current CD measurements.

To this purpose, the processor unit 200 may use a preset wafer exposure model that interpolates field fine and/or intra-field fine correction values for at least one exposure parameter on the basis of the comparatively low number of sampling points. In addition, the processor unit 200 may update the coefficients of the preset wafer exposure model on the basis of the current CDs obtained at the sampling points of the current substrate.

The processor unit 200 further includes wafer exposure model update functionality as described above. Each wafer exposure model update may include at least one of two steps. A first step may determine the maximum order for polynomials used for the updated wafer model. A second step may remove, from all polynomials up to the maximum order, such polynomials that do not or that only to a negligible degree improve the updated wafer exposure model in view of the deviations from the actual critical dimension values.

The nomenclature "first step" and "second step" is not to be understood as indicating an implicit chronological sequence. The second step may follow the first step, may be interleaved with the first step or may be carried out contemporaneously with the first step such that the result of the second step may be available contemporaneously with or even before the end of the first step.

Alternatively or in addition, the processor unit 200 may receive overlay discrepancies obtained from overlay marks at least partly formed in the developed photoresist structures and/or in the post-processed wafer substrates 100. The processor unit 200 may include a stage control functionality. Based on overlay information obtained from one or more wafer substrates 100 previously processed at the same exposure tool assembly 300 or at another exposure tool assembly, the processor unit 200 may add position offsets to the exposure position.

To this purpose, the processor unit 200 may use a preset wafer overlay model that interpolates field fine and/or intra-field fine correction values for the position offsets on the basis of the overlay errors detected at overlay marks. In addition, the processor unit 200 may update the coefficients of the preset wafer overlay model on the basis of the current overlay discrepancy values obtained at the overlay marks.

The processor unit 200 further includes wafer overlay model update functionality as described above. Each wafer overlay model update may include at least one of the two steps as described above for the wafer exposure update functionality.

Figure 2:
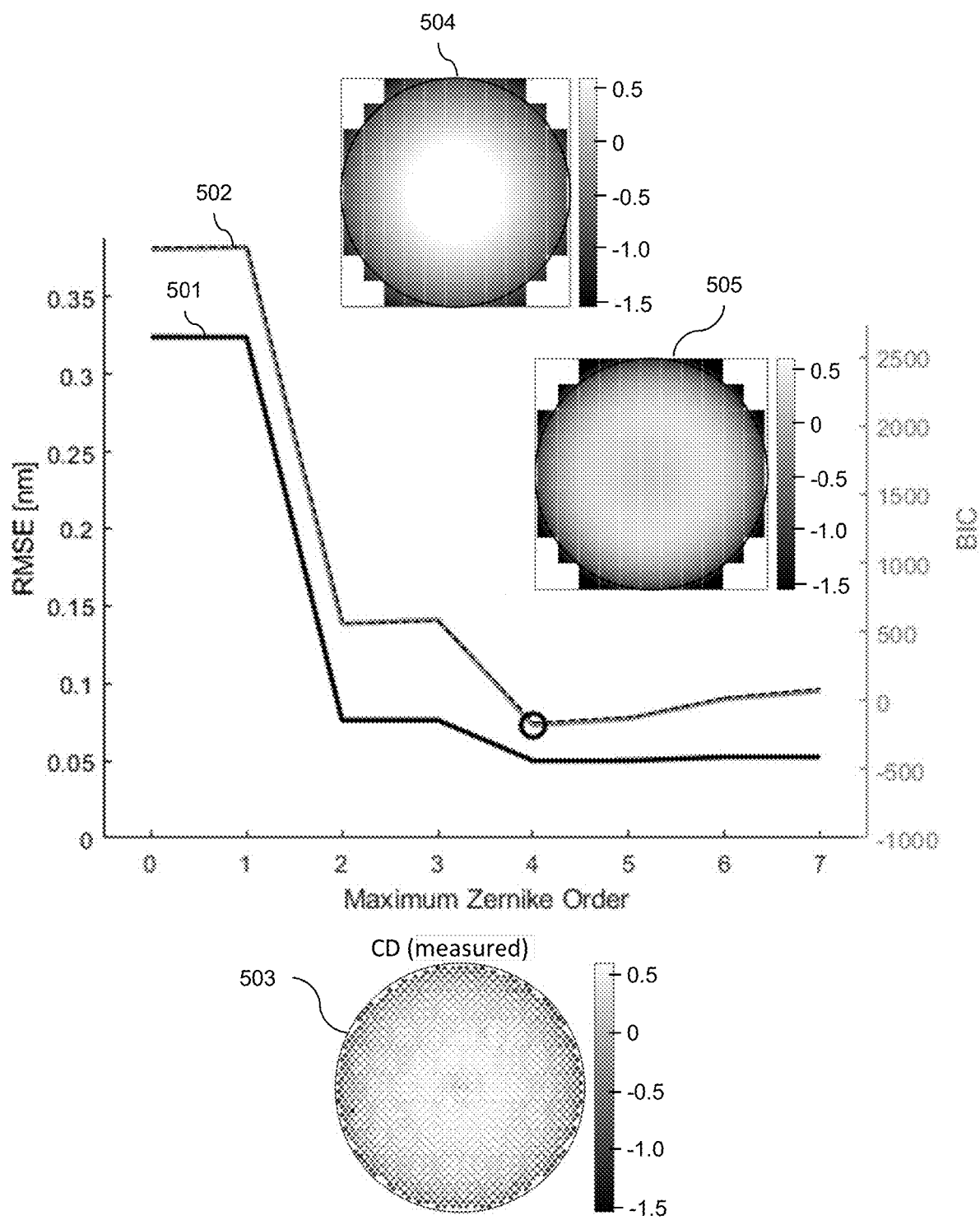
FIG. 2 is a schematic diagram for illustrating the effect of a penalty term in a wafer model update process according to the embodiments.

FIG. 2 refers to the first step of a wafer model update. Line 501 illustrates the RMSE (root mean square error) and line 502 illustrates the BIC for wafer models using Zernike polynomials up to different maximum orders. Inserted image 503 schematically visualizes an exemplary CD distribution on a substrate main surface, wherein different grey levels indicate different critical dimension values. The exemplary CD distribution is predominantly point symmetric to the center of the substrate main surface.

For the exemplary CD distribution of inserted image 503, the Zernike polynomials of the first order, which would describe mono-directional CD-variations, do not contribute in any improvement of the wafer model.

One of the second order Zernike polynomials describes point-symmetric variations. By adding the polynomials of the second order, both RMSE and BIC can significantly drop. Inserted image 504 schematically visualizes the CD distribution described by a wafer model that may use all Zernike polynomials up to the second order.

A further significant drop of both RMSE and BIC can be observed at the transition from a wafer model using the third order Zernike polynomials to a wafer model using the fourth order Zernike polynomials. Inserted image 505 schematically visualizes the CD distribution described by a wafer model using all Zernike polynomials up to the fourth order. Inserted image 505 shows significant greater agreement with the exemplary CD distribution of inserted image 503 than the inserted image 504.

Using terms beyond the fourth order may further improve RMSE. But the rising BIC value rather indicates that the further orders only contribute in imaging noise. For this example, a wafer model using the Zernike polynomials up to the fourth order has the minimum BIC value. The minimum BIC value indicates with high probability the maximum Zernike order for the best suited wafer model. In other words, the minimum BIC value indicates up to which order Zernike polynomials contribute in imaging systematic effects and from which order on Zernike polynomials rather follow noise.

The second step may include verifying the relevance of each polynomial up to the determined maximum order. In the example of FIG. 2 the polynomials of the first and third order are obviously without significant impact on the RMSE and the updated wafer model may get along without the polynomials of the first and third order. If for a substrate exposed at a later point in time it turns out that a wafer model using one of the first or third order polynomials results in reduced RMSE, this may indicate a significant change of the process signature. The wafer model may be adapted to the new process signature just-in-time with the first occurrence of the newly detected process signature.

Referring again to FIG. 1, the processor unit 200 may output information about the composition of the updated wafer model through an interface unit 290. The interface unit 290 may include a display, at which the information may be presented to a human operator. Alternatively or in addition the interface unit 290 may include a data link to a higher-order process monitoring and/or administration system. Alternatively or in addition, the processor unit 200 may use the updated wafer model for determining updated exposure parameters for the next exposure.

Figure 3A:
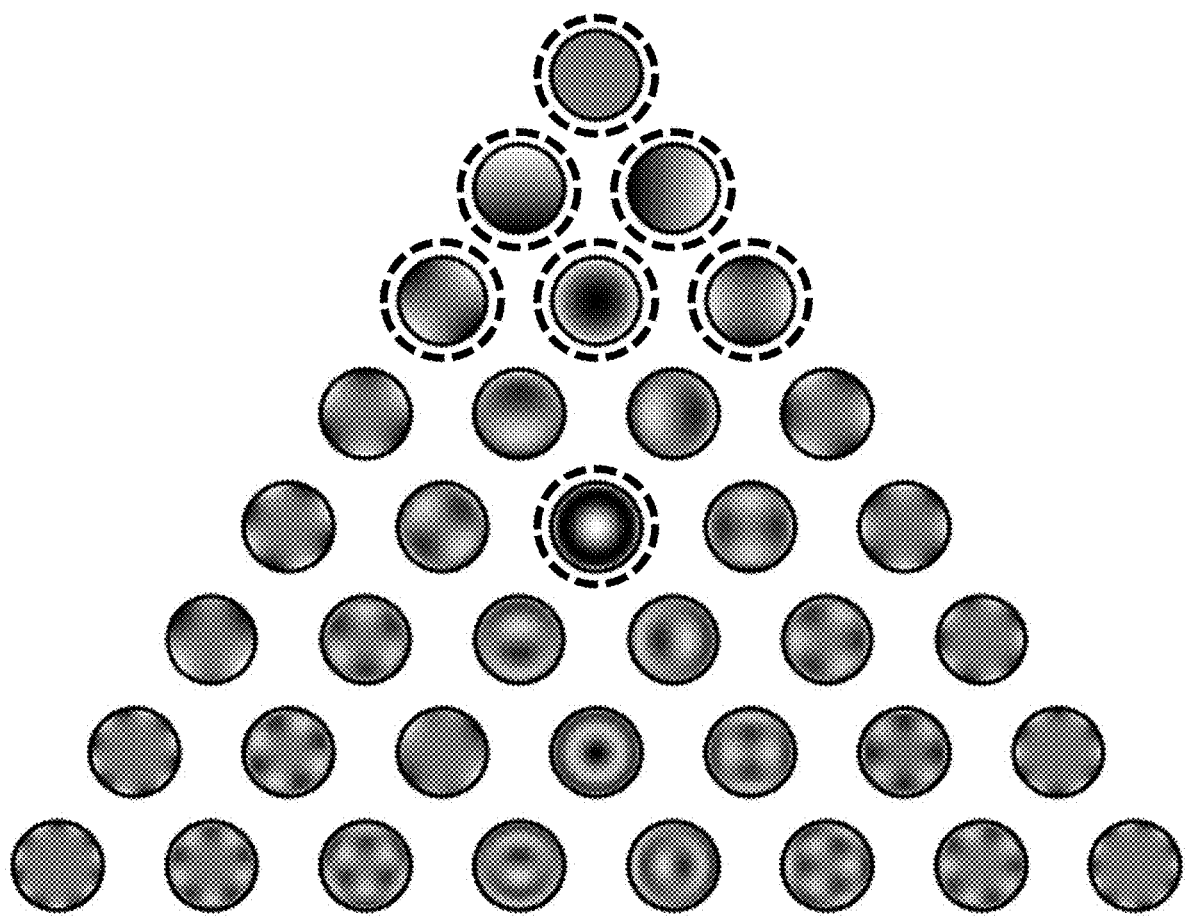
FIGS. 3A and 3B schematically illustrate the selection of Zernike polynomials for an updated wafer model according to an example for illustrating effects of the embodiment.
Figure 3B:
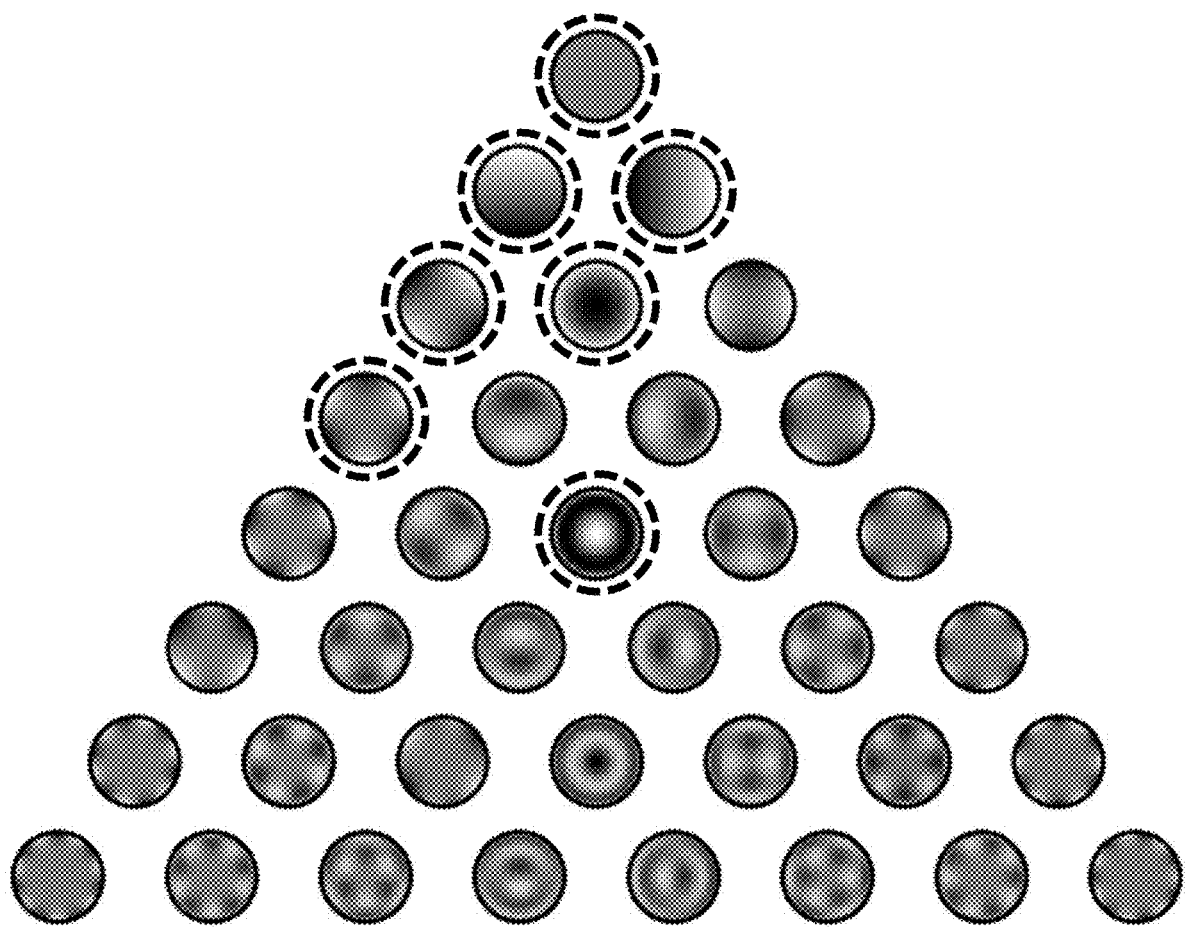

FIGS. 3A and 3B visualize a possible wafer model update. The result of a first wafer model update step may be that terms beyond the fourth order do not improve the wafer model. Then the quality of wafer models including all 32768 possible combinations of the fifteen Zernike polynomials up to the fourth order may be verified.

The quality of each wafer model may be determined based on a first term indicating the total amount of residuals, e.g. RMSE and a second term indicating the number of polynomials, e.g. BIC.

For a first substrate the result of the second wafer model update step may be that a wafer model including all Zernike polynomials up to the second order and the point-symmetric Zernike polynomial of the fourth order delivers the best fitting wafer model.

In FIG. 3A the Zernike polynomials of the best wafer model determined for the first substrate are marked with dotted circles.

For a second substrate processed later at the same exposure tool, the result of the second wafer model update step may be that a wafer model including one of the third order Zernike polynomials instead of one of second order Zernike polynomials may deliver a better wafer model than the best wafer model for the first substrate.

In FIG. 3B the Zernike polynomials of the best fitting wafer model for the second substrate are marked with dotted circles.

The alteration of the wafer model on polynomial level may indicate a characteristic change of the process signature. This change may be signalized to a higher-order process monitoring and/or administration system or to a human operator. In addition, the updated wafer model can be used for a just-in-time response of the exposure tool to the changed process signature.

In the alternative, the "updated" wafer model is only used for signalizing changes in the process signature, whereas a wafer model using all Zernike polynomials up to the determined maximum order may be used for updating the exposure parameters.

Alternatively or in addition to the second wafer model update step, the wafer model update may include a third wafer model update step. The third wafer model update step may consider quality indices as stability criteria for selecting the polynomials of the updated wafer model. The quality index may be based on geometrical considerations and/or may be based on statistical considerations.

FIG. 4 shows a flow chart illustrating an embodiment using a wafer exposure model update 700. In step 702 a default wafer model may be selected as current wafer model. The selection may be based on empirical knowledge.

Step 710 determines, on the basis of mark-fine measurement data 705 obtained from a metrology tool at predefined measurement sites (e.g. sampling points defined in a sampling plan), the model coefficients 795 for the current wafer exposure model. The model coefficients 795 may be transmitted to an APC system.

If the wafer exposure model update is enabled, the wafer exposure model update 700 may replace the default wafer exposure model in step 710 with an updated wafer exposure model, provided that the updated wafer exposure model fulfills certain requirements.

To this purpose the wafer exposure model update may initialize an updated wafer exposure model with the preset default wafer exposure model in step 720.

Step 730 generates a further wafer exposure model that differs in at least one term form the updated wafer exposure model and all previously checked wafer exposure models.

Step 740 checks which one of the further wafer exposure model and the updated wafer exposure model provides better coefficient selection, e.g., the better BIC value. For example, if the BIC value of the further wafer exposure model is not lower than the BIC value of the updated wafer exposure model, the further wafer exposure model is not expected to perform better than the preset wafer exposure model and the wafer exposure model update proceeds with step 780. Otherwise, the wafer exposure model update proceeds with step 750.

Step 750 checks whether the further wafer exposure model will perform sufficiently stable and will fulfill a stability criterion. For example, if the further wafer exposure model does not pass a bootstrapping test as described above, the further wafer exposure model is not expected to perform sufficiently stable and the wafer exposure model update proceeds with step 780. Otherwise, the wafer exposure model update proceeds with step 760.

Step 760 checks whether the further wafer exposure model passes the normality test. For example, if the further wafer exposure model does not pass the normality test as described above, the further wafer exposure model is not expected to cover all significant process signatures sufficiently and the wafer exposure model update proceeds with step 780. Otherwise, the wafer exposure model update proceeds with step 770.

In step 770 the current further wafer exposure model, which is assumed to perform sufficiently stable and better than the previously updated wafer exposure model, is defined as the new updated wafer exposure model. Then the wafer exposure model update proceeds with step 780.

Step 780 checks whether another possible wafer exposure model exists that has not been checked before. If so, the wafer exposure model update returns to step 730. Otherwise, the wafer exposure model update proceeds with step 790.

Step 790 replaces the default wafer exposure model used in step 710 with the last updated wafer exposure model.

For illustration, various scenarios have been described with respect to methods monitoring process signatures and methods for adapting an exposure method to a change of process signatures. Similar techniques may be implemented in combination with methods monitoring alignment of substrates in exposure tool assemblies and methods monitoring the overlay of successive exposures on the same substrate. In the following, previously defined terms are used in the same sense as above.

According to an embodiment, an alignment method may include: measuring geometrical values of alignment marks formed on and/or in a substrate;

determining, from the geometrical values, coefficients of a preset alignment model and at least one further alignment model, wherein each further alignment model differs in at least one term from the preset alignment model and from the other models, and wherein the alignment models approximate the geometrical values and/or correction values for the geometrical values in dependence of at least two position coordinates;

determining residuals between the output of the alignment models and the geometrical values; and selecting, among the preset alignment model and the at least one further alignment model, an updated alignment model, wherein the selection is based on a criterion considering the residuals and the number of terms of the alignment model.

An alignment mark may include one or more spatially separated substrate features, e.g., grooves or structures of a material that differs from the surrounding material. Typically, alignment marks on a substrate are used to align a substrate to a reticle of an exposure unit.

After positioning the substrate on a stage in the exposure tool and, if applicable, after an automated pre-alignment and prior to exposure, geometrical values of one or more alignment marks may be obtained, e.g., by a metrology unit integrated in the exposure tool. The geometrical values may be descriptive for a substrate misalignment in the exposure tool, e.g., a misalignment between a projection of the alignment mark(s) of the reticle on the substrate and the alignment mark(s) on the substrate.

From the obtained geometrical values, coefficients of a preset alignment model may be determined. The preset alignment model may include the alignment model which has been used for determining the stage parameters for the previous exposure. The stage parameters may include an x offset value and an y offset value. The x offset value and the y offset value may describe the displacement of the stage from a normal position. In addition, the coefficients of at least one further alignment model may be determined, wherein each further alignment model may differ in at least one term from the preset alignment model and in at least one term from the other further alignment models.

Each alignment model approximates the geometrical values (the "misalignment") across the substrate main surface in closed mathematical form. The alignment model receives input information obtained from measurements at the alignment marks. From the input information, the alignment model derives output information descriptive for a misalignment across the complete substrate main surface. The input information may include the measured misalignment at the alignment marks. The output information may include the estimated position-dependent misalignment, updated position-dependent x/y offset values and/or position-dependent x/y offset correction values as a function of the position. The output information may be displayed, transmitted to a higher-order process monitoring and/or administration system and/or may be used for improving the alignment for the current substrate, wherein the position of the stage may be fine-tuned in response to the position-dependent x/y offset values.

The position may be described in position coordinates that unambiguously define each point of the substrate main surface. The position coordinates may be orthogonal linear coordinates (x, y coordinate system) or polar coordinates (r, φ).

Each alignment model is represented by a sum of terms. Each (model) term includes at least one position coordinate and a coefficient. For example, each term may be a product of a coefficient and a function of at least one position coordinate.

According to an embodiment, the alignment model may include the terms as represented in equations (3) and (4).

$$\Delta x = \Gamma_3 \cdot x + R_3 \cdot x \cdot y + WM_3 \cdot y \qquad \text{equation (5):}$$

$$\Delta y = \Gamma_4 \cdot y + R_4 \cdot x \cdot y + WM_4 \cdot x \qquad \text{equation (6):}$$

The coefficients of each alignment model may be obtained from a fitting algorithm. The fitting algorithm searches for coefficients that minimize deviations between modelled misalignment and actual misalignment at the alignment marks. The actual misalignment is the one directly obtained from the alignment mark(s) of the current substrate. The model misalignment is what the alignment model outputs for the position of the alignment marks. The fitting algorithm may include a least squares method.

Then, for each concerned alignment model separately, residuals between the output of the alignment model and the misalignment obtained at the alignment marks are determined. In other words, for each concerned alignment model separately, the remaining differences between model misalignment and the actual misalignment are determined.

Then, among the preset alignment model and the at least one further alignment model, an updated alignment model is selected. The selection may be based on a criterion that weights the magnitude and/or the distribution of the residuals against the number of terms of the alignment model as described above for the wafer models.

According to an embodiment, information descriptive for the terms of the updated alignment model may be output. For example, any change of alignment model terms may be displayed to a human operator or to a higher-order process monitoring and/or administration system. Any skip of a term of the alignment model and any insertion of a term may indicate some significant change in the substrate history or in the performance of the exposure tool. Therefore the information about cancelled alignment model terms and/or about newly introduced alignment model terms may be useful for process control.

According to an embodiment, the position-dependent x/y offset values used in the exposure of the substrate may be updated on the basis of the updated alignment model.

According to an embodiment, an exposure method may include:

obtaining critical dimensions from a wafer structure at sampling points and position-dependent exposure parameters used in an exposure process that defines the wafer structure; determining, from the critical dimensions at the sampling points, coefficients of a preset wafer exposure model and at least one further wafer exposure model, wherein each further wafer exposure model differs in at least one term from the preset wafer exposure model and from the other wafer exposure models, and wherein the wafer exposure models approximate the critical dimensions, exposure parameters and/or exposure parameters correction values as a function of at least two position coordinates;

determining residuals between approximated critical dimensions obtained from the wafer exposure models and the critical dimensions obtained at the sampling points; and selecting, among the preset wafer exposure model and the at least one further wafer exposure model, an updated wafer exposure model, wherein the selection is based on a criterion weighting the residuals, the number of terms of the wafer exposure model and/or the order of terms of the wafer exposure model.

According to a further embodiment, an overlay metrology method may include:

According to an embodiment, an overlay analyzing and correction method may include:

obtaining overlay discrepancy values from a wafer substrate at measurement sites;

obtaining position-dependent position offsets used in an exposure process that affects the overlay discrepancy values;

determining, from the overlay discrepancy values at the measurement sites, coefficients of a preset wafer overlay model and at least one further wafer overlay model, wherein each further wafer overlay model differs in at least one term from the preset wafer overlay model and from the other wafer overlay models, and wherein the wafer overlay models approximate the overlay discrepancy values, position offsets and/or position offset correction values as a function of at least two position coordinates;

determining residuals between approximated overlay discrepancy values obtained from the wafer overlay models and the overlay discrepancy values obtained at the measurement sites; and selecting, among the preset wafer overlay model and the at least one further wafer overlay model, an updated wafer overlay model, wherein the selection is based on a criterion weighting the residuals, the number of terms of the wafer overlay model and/or the order of terms of the wafer overlay model.

The measurement sites may include overlay marks. The overlay discrepancy values may be obtained from the overlay. The wafer overlay model may include terms as given in equations (3) and (4).

What is claimed is:

1. A wafer exposure method, comprising:
    obtaining critical dimension values from wafer structures at predefined measurement sites;
    obtaining position-dependent process parameters of an exposure process used for forming the wafer structures;
    determining, from the critical dimension values at the measurement sites, coefficients of a preset model and coefficients of at least one further model, wherein each further model differs in at least one term from the preset model and from other further models, and wherein the preset model and the at least one further model approximate the critical dimension values across a main surface of a wafer substrate in a closed mathematical form, the position-dependent process parameters and/or correction values of the position-dependent process parameters as an algebraic function of two position coordinates, wherein the at least one term is a product of a coefficient and the algebraic function of at least one of the position coordinates;
    determining residuals between approximated critical dimension values obtained from the preset model and the at least one further model and the critical dimension values obtained at the measurement sites; and
    selecting, among the preset model and the at least one further model, an updated model, wherein the selection is based on a criterion weighting the residuals optionally with the number of terms of the preset model and the at least one further model and/or an order of terms of the preset model and the at least one further model.

2. The wafer exposure method according to claim 1, further comprising:
    outputting information descriptive for terms of the updated model.

3. The wafer exposure method according to claim 1, further comprising:
    updating the position-dependent process parameters on the basis of the updated model.

4. The wafer exposure method according to claim 1, wherein
    the selection of the updated model is based on a trade-off that weights the number of terms of the preset model and the at least one further model against a total amount of the residuals.

5. The wafer exposure method according to claim 1, wherein
    the selection of the updated model is based on at least one of a Bayesian information criterion and an Akaike information criterion.

6. The wafer exposure method according to claim 1, wherein
    the models include at least one of Zernike polynomials and Legendre polynomials.

7. The wafer exposure method according to claim 1, wherein
    the at least one further model includes all Zernike polynomials up to a maximum order.

8. The wafer exposure method according to claim 1, further comprising:
    determining a quality index for each coefficient of the updated model, wherein the quality index gives information of a degree of dependency of the coefficient from variations of the critical dimension values.

9. The exposure method according to claim 1, wherein
    the selection is based on a criterion that weights a distribution of the residuals.

10. The wafer exposure method according to claim 1, wherein
    the critical dimension values comprise overlay discrepancy values,
    the process parameters used in the exposure process comprise position offsets, and
    each model comprises a wafer overlay model approximating the overlay discrepancy values, the position offsets and/or correction values of the position offsets as a function of the position coordinates.

11. The wafer exposure method according to claim 1, wherein
    the critical dimension values comprise critical dimensions of the wafer structures,
    the process parameters used in the exposure process comprise exposure parameters, and
    each model comprises a wafer exposure model approximating the critical dimensions, the exposure parameters and/or correction values of the exposure parameters as a function of the position coordinates.

12. The wafer exposure method according to claim 1, wherein
    the wafer structures comprise photoresist structures.

13. The wafer exposure method according to claim 12, further comprising:
    exposing a first photoresist layer formed on a first wafer substrate, wherein the exposure uses the position-dependent exposure parameters; and
    developing the exposed first photoresist layer, wherein the patterned photoresist structure is obtained from the exposed photoresist layer.

14. The wafer exposure method according to claim 13, further comprising:
    exposing a second photoresist layer formed on a second wafer substrate, wherein the exposure uses position-dependent exposure parameters obtained from an updated wafer exposure model.

15. A wafer fabrication assembly, comprising:
    an exposure tool assembly configured to expose photoresist layers coating wafer substrates to an exposure beam using position-dependent process parameters and to define wafer structures on the basis of the exposed photoresist layers;
    a processor unit data-connected with the exposure tool assembly, wherein the processer unit is configured to:
        receive and/or hold position-dependent process parameters used in the exposure tool assembly for defining the wafer structures,
        receive critical dimension values of the wafer structures at predefined measurement sites, determine, from the critical dimension values at the predefined measurement sites, coefficients of a preset model and of at least one further model, wherein each further model differs in at least one term from the preset model and from other further models, and wherein the preset model and the at least one further model approximate the critical dimension values across a main surface of one of the wafer substrates in a closed mathematical form, the position-dependent process parameters, and/or correction values of the position-dependent process parameters as an algebraic function of at least two position coordinates, wherein the at least one term is a product of a coefficient and the algebraic function of at least one of the position coordinates;

determine residuals between approximated critical dimension values obtained from the preset model and the at least one further model and the critical dimension values obtained at the measurement sites; and select, among the preset model and the at least one further model, an updated model, wherein the selection is based on a criterion weighting the residuals optionally with the number of terms of the preset model and the at least one further model and/or an order of terms of the preset model and the at least one further model.

16. The wafer fabrication assembly according to claim 15, wherein the processor unit (200) is further configured to output information descriptive for terms of the updated model.

17. The wafer fabrication assembly according to claim 15, wherein the processor unit is further configured to update the position-dependent process parameters on the basis of the updated model and to output the updated position-dependent process parameters to the exposure tool assembly.

18. The wafer fabrication assembly according to claim 17, further comprising a metrology unit configured to obtain the critical dimension values of the wafer structures at the measurement sites and to output the measured critical dimension values to the processor unit.

19. The wafer fabrication assembly according to claim 15, wherein the critical dimension values comprise overlay discrepancy values, the correction parameters used in the exposure process comprise position offsets, and each model comprises a wafer overlay model approximating the overlay discrepancy values, the position offsets and/or correction values of the position offsets as a function of the position coordinates.

20. The wafer fabrication assembly according to claim 15, wherein the critical dimension values comprise critical dimension values of the wafer structures, the correction parameters used in the exposure process comprise exposure parameters, and each model comprises a wafer exposure model approximating the critical dimension values, the exposure parameters and/or correction values of the exposure parameters as a function of the position coordinates.

* * * * *